(12) United States Patent
Nien et al.

(10) Patent No.: US 11,189,497 B2
(45) Date of Patent: Nov. 30, 2021

(54) CHEMICAL MECHANICAL PLANARIZATION USING NANO-ABRASIVE SLURRY

(71) Applicant: Taiwan Semiconductor Manufacturing Company, Ltd., Hsinchu (TW)

(72) Inventors: Po-Chin Nien, Taipei (TW); Gang Huang, Hsinchu (TW); William Weilun Hong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/415,981

(22) Filed: May 17, 2019

(65) Prior Publication Data
US 2020/0365413 A1   Nov. 19, 2020

(51) Int. Cl.
| | | |
|---|---|---|
| *H01L 21/321* | (2006.01) | |
| *H01L 21/768* | (2006.01) | |
| *H01L 21/02* | (2006.01) | |
| *H01L 21/67* | (2006.01) | |
| *C09G 1/02* | (2006.01) | |

(52) U.S. Cl.
CPC .... *H01L 21/3212* (2013.01); *H01L 21/02274* (2013.01); *H01L 21/7684* (2013.01); *C09G 1/02* (2013.01); *H01L 21/67017* (2013.01); *H01L 21/67092* (2013.01)

(58) Field of Classification Search
CPC ............ H01L 21/3212; H01L 21/7684; H01L 21/02274; H01L 21/67092; H01L 21/67017; C09G 1/02
See application file for complete search history.

(56) References Cited

U.S. PATENT DOCUMENTS

| | | | | |
|---|---|---|---|---|
| 6,149,506 A | * | 11/2000 | Duescher | B24B 1/00 451/178 |
| 6,325,676 B1 | * | 12/2001 | Jung | H01L 21/31055 216/67 |
| 9,190,316 B2 | * | 11/2015 | Brink | H01L 23/5226 |
| 2004/0157464 A1 | * | 8/2004 | Izumitani | H01L 21/76805 438/723 |
| 2013/0233018 A1 | * | 9/2013 | Takashima | C03B 32/00 65/30.13 |
| 2015/0376461 A1 | * | 12/2015 | Grumbine | C09K 3/1463 216/53 |
| 2016/0107286 A1 | * | 4/2016 | Sakashita | B24B 37/00 451/36 |
| 2016/0181118 A1 | * | 6/2016 | Kudou | H01L 21/31116 438/718 |

(Continued)

OTHER PUBLICATIONS

Steigerwald et al. (Chemical Mechanical Planarization of Microelectronic Materials, 1997 published by John Wiley & Sons, Inc.) (Year: 1997).*

(Continued)

*Primary Examiner* — Duy Vu N Deo
*Assistant Examiner* — Mahmoud Dahimene
(74) *Attorney, Agent, or Firm* — Slater Matsil, LLP

(57) ABSTRACT

A method includes forming a film over a substrate; increasing a surface roughness of the film; and planarizing the film using a first chemical mechanical planarization (CMP) process after increasing the surface roughness.

20 Claims, 12 Drawing Sheets

(56) References Cited

U.S. PATENT DOCUMENTS

| | | | | |
|---|---|---|---|---|
| 2016/0190240 A1* | 6/2016 | Fang | ................. | H01L 21/76229 |
| | | | | 257/506 |
| 2016/0315014 A1* | 10/2016 | Chou | .................. | H01L 21/3247 |
| 2017/0301583 A1* | 10/2017 | Zhang | ............... | H01L 21/76829 |
| 2019/0311952 A1* | 10/2019 | Nishida | ............... | H01L 21/3221 |

OTHER PUBLICATIONS

Wafer Specification (Used only as evidence) found in https://www.microchemicals.com/products/wafers/wafer_specification.html (Year: 2021).*

* cited by examiner

CHEMICAL MECHANICAL PLANARIZATION USING NANO-ABRASIVE SLURRY

BACKGROUND

Generally, semiconductor devices comprise active components, such as transistors, formed on a substrate. Any number of interconnect layers may be formed over the substrate connecting the active components to each other and to outside devices. The interconnect layers are typically made of low-k dielectric materials comprising metallic trenches/vias.

As the layers of a device are formed, planarization processes may be performed to planarize the layers to facilitate formation of subsequent layers. For example, the formation of metallic features in the substrate or in a metal layer may cause uneven topography. This uneven topography may create difficulties in the formation of subsequent layers. For example, uneven topography may interfere with the photolithographic process commonly used to form various features in a device. Therefore, it may be advantageous to planarize the surface of the device after various features or layers are formed.

Chemical Mechanical Polishing (CMP) is a common practice in the formation of integrated circuits. Typically, CMP is used for the planarization of semiconductor wafers. CMP takes advantage of the synergetic effect of both physical and chemical forces for the polishing of wafers. It is performed by applying a load force to the back of a wafer while the wafer rests on a polishing pad. A polishing pad is placed against the wafer. Both the polishing pad and the wafer are then rotated while a slurry containing both abrasives and reactive chemicals is passed therebetween. CMP is an effective way to achieve global planarization of wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
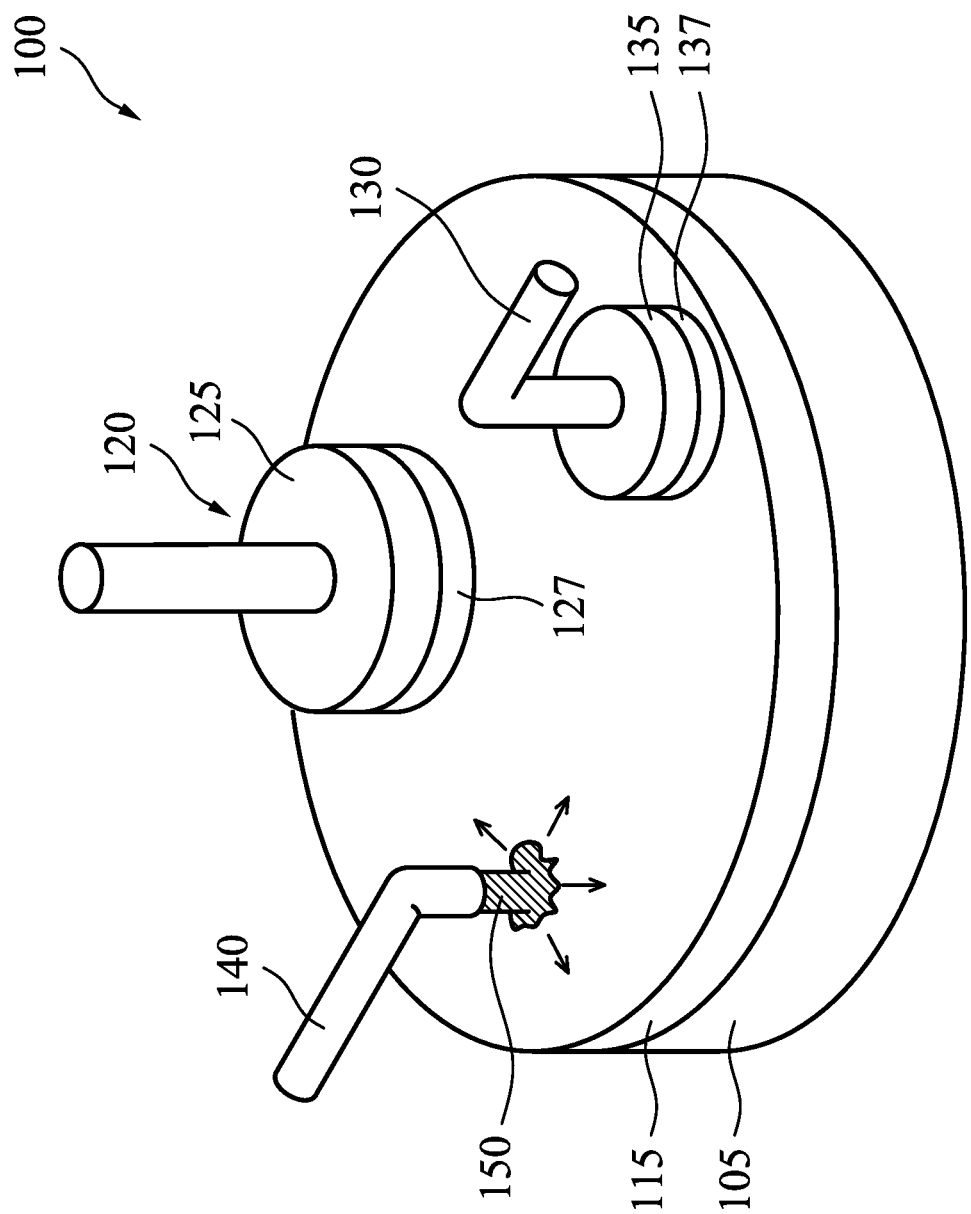
FIG. 1 illustrates a perspective view of a chemical mechanical planarization apparatus, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various representative embodiments are described with respect to planarizing a layer through a CMP processes using a nano-abrasive slurry, and in particular, treating the surface of the layer to achieve improved etch rate for the CMP process. In an embodiment, treating the surface of the layer comprises treating the surface of the layer using a plasma process. In another embodiment, treating the surface of the layer comprises, before performing the CMP process using the nano-abrasive slurry, performing another CMP process using a high-pressure diluted nano-abrasive slurry. In yet another embodiment, treating the surface of the layer comprises performing a wet etch process or a cleaning process. The various embodiment methods for treating the surface of the layer increases the surface roughness of the layer, which results in improved etch rate for the CMP process.

Chemical mechanical planarization (CMP) is a method of planarizing features produced in the manufacture of semiconductor devices. The process uses an abrasive material in a reactive chemical slurry in conjunction with a polishing pad. The polishing pad typically has a greater diameter than that of the semiconductor wafer. The pad and wafer are pressed together during the CMP process. The process removes material and tends to even out irregular topography, making the wafer flat or substantially planar. This prepares the wafer for the formation of additional overlying circuit elements. For example, chemical mechanical planarization can bring an entire wafer surface within a given depth of field of a photolithography system. Typical depth-of-field specifications are on the order of, e.g., angstroms. In some implementations, chemical mechanical planarization may also be employed to selectively remove material based on its location on the wafer.

In a CMP process, a wafer is placed in a carrier head (also referred to as a carrier), where the wafer is held in place by a retaining ring. The carrier head and the wafer are then rotated as downward pressure is applied to the wafer to press against the polishing pad. A reactive chemical solution is dispensed on a contacting surface of the polishing pad to aid planarization. The surface of a wafer may thus be planarized using a combination of both mechanical and chemical mechanisms.

FIG. 1 illustrates a perspective view of a chemical mechanical planarization apparatus 100 in accordance with some embodiments. The chemical mechanical planarization apparatus 100 includes a platen 105 and a polishing pad 115 over (e.g., glued to) the platen 105. In some embodiments, the polishing pad 115 includes a single layer or a composite layer of materials, such as felts, polymer impregnated felts, microporous polymer films, microporous synthetic leathers, filled polymer films, unfilled textured polymer films, combinations thereof, or the like. Representative polymers include polyurethane, polyolefins, or the like.

As illustrated in FIG. 1, a polisher head 120 is placed over the polishing pad 115. The polisher head 120 includes a carrier 125 and a retainer ring 127. The retainer ring 127 is mounted to the carrier 125 using mechanical fasteners (e.g., screws, or the like) or other suitable attachment means. During a representative chemical mechanical planarization process, a workpiece (e.g., a semiconductor wafer; not shown in FIG. 1 but illustrated and described below with respect to FIG. 3) is placed within the carrier 125 and is held by the retainer ring 127. In some embodiments, the retainer ring 127 has a substantially annular shape with a substantially hollow center. The workpiece is placed in the center of the retainer ring 127 such that the retainer ring 127 holds the workpiece in place during a chemical mechanical planarization process. The workpiece is positioned such that a surface to be polished faces in a direction (for example, downward) towards the polishing pad 115. The carrier 125 is configured to apply downward force or pressure urging the workpiece into contact with the polishing pad 115. The polisher head 120 is configured to rotate the workpiece over the polishing pad 115 during the chemical mechanical planarization process, thereby imparting mechanical abrading action to affect planarization or polishing of a contacting surface of the workpiece.

In some embodiments, the chemical mechanical planarization apparatus 100 includes a slurry dispenser 140 configured to deposit a slurry 150 onto the polishing pad 115. The platen 105 is configured to rotate, causing the slurry 150 to be distributed between the workpiece and the platen 105 through a plurality of grooves in the retainer ring 127. The plurality of grooves may extend from an outer sidewall of the retainer ring 127 to an inner sidewall of the retainer ring 127.

The composition of the slurry 150 may depend on which types of material are to be polished or removed. For example, the slurry 150 may comprise a reactant, an abrasive, a surfactant, and a solvent. The reactant may be a chemical, such as an oxidizer or a hydrolyzer, which chemically reacts with a material of the workpiece in order to assist the polishing pad 115 in abrading or removing material. In some embodiments in which the material to be removed includes, e.g., tungsten, the reactant may be, e.g., hydrogen peroxide, Cr2O7, MnO4, OsO4; although other suitable reactants, such as hydroxylamine, periodic acid, other periodates, iodates, ammonium persulfate, peroxomonosulfates, peroxymonosulfuric acid, perborates, malonamide, combinations of same, or the like, that are configured to aid removal of material may be alternatively, conjunctively, or sequentially employed. In other embodiments, other reactants may be used to remove other types of materials. For example, in embodiments in which a material to be removed includes, e.g., an oxide, the reactant may comprise, e.g., nitric acid ($HNO_3$), potassium hydroxide (KOH), ammonium hydroxide ($NH_4OH$), combinations thereof, or the like.

The abrasive may include any suitable particulate that, in conjunction with the relative mechanical movement of the polishing pad 115, is configured to polish or planarize the workpiece. In some embodiments, the abrasive includes colloidal aluminum oxide. In some embodiments, the abrasive includes silicon oxide, aluminum oxide, cerium oxide, polycrystalline diamond, polymer particles (e.g., polymethacrylate, or the like), combinations thereof, or the like.

The surfactant may be utilized to help disperse the reactant(s) and abrasive(s) within the slurry 150, and to prevent (or otherwise reduce the occurrence of) agglomeration of the abrasive during the chemical mechanical planarization process. In some embodiments, the surfactant may include polyethylene glycol (PEG), polyacrylic acid, sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations thereof, or the like. However, such representative embodiments are not intended to be limited to the recited surfactants. Those skilled in the art will appreciate that any suitable surfactant may be alternatively, conjunctively, or sequentially employed.

In some embodiments, the slurry 150 includes a solvent that may be utilized to combine the reactant(s), the abrasive(s), and the surfactant(s), and allow the mixture to be moved and dispersed onto the polishing pad 115. In some embodiments, the solvent includes, e.g., deionized water (DIW), alcohol, or an azeotropic mixture thereof; however, other suitable solvent(s) may be alternatively, conjunctively, or sequentially employed.

Additionally, if desired, other additives may also be added in order to help control or otherwise benefit the CMP process. For example, a corrosion inhibitor may be added in order to help control the corrosion. In one particular embodiment the corrosion inhibitor may be an amino acid such as glycine. However, any suitable corrosion inhibitor may be utilized.

In another embodiment, a chelating agent(s) is added to the slurry 150. The chelating agent may be an agent such as ethylenediaminetetraacetic acid (EDTA), $C_6H_8O_7$, $C_2H_2O_4$, combinations thereof, or the like. However, any suitable chelating agent may be utilized.

In yet another embodiment, the slurry 150 includes a pH adjuster(s) in order to control the pH value of the slurry 150. For example, a pH adjuster such as HCl, $HNO_3$, $H_3PO_4$, $C_2H_2(COOH)_2$, KOH, $NH_4OH$, combinations thereof, or the like, may be added to the slurry 150 in order to adjust the pH value of the slurry 150 up or down.

Additionally, other additives may also be added to help control and manage the CMP process. For example, downforce enhancers (e.g., an organic compound), polish rate inhibitors, or the like may also be added. Any suitable additives which may be useful to the polishing process may be utilized, and all such additives are fully intended to be included within the scope of the embodiments.

In some embodiments, the chemical mechanical planarization apparatus 100 includes a pad conditioner 137 attached to a pad conditioner head 135. The pad conditioner head 135 is configured to rotate the pad conditioner 137 over the polishing pad 115. The pad conditioner 137 is mounted to the pad conditioner head 135 using mechanical fasteners (e.g., screws, or the like) or by other suitable attachment means. A pad conditioner arm 130 is attached to the pad conditioner head 135, and is configured to move the pad conditioner head 135 and the pad conditioner 137 in a sweeping motion across a region of the polishing pad 115. In some embodiments, the pad conditioner head 135 is mounted to the pad conditioner arm 130 using mechanical fasteners (e.g., screws, or the like) or by other suitable attachment means. The pad conditioner 137 comprises a substrate over which an array of abrasive particles is bonded. The pad conditioner 137 removes built-up wafer debris and excess slurry 150 from the polishing pad 115 during the CMP processing. In some embodiments, the pad conditioner 137 also acts as an abrasive for the polishing pad 115 to renew, or create a desired texture (such as, e.g., grooves, or the like) against which the workpiece may be polished.

As illustrated in FIG. 1, the chemical mechanical planarization apparatus 100 has a single polisher head (e.g., 120) and a single polishing pad (e.g., 115). However, in other embodiments, the chemical mechanical planarization apparatus 100 may have multiple polisher heads or multiple polishing pads. In some embodiments in which the chemical mechanical planarization apparatus 100 has multiple polisher heads and a single polishing pad, multiple workpieces (e.g., semiconductor wafers) may be polished at a same time. In other embodiments in which the chemical mechanical planarization apparatus 100 has a single polisher head and multiple polishing pads, a chemical mechanical planarization process may include a multi-step process. In such embodiments, a first polishing pad may be used for bulk material removal from a wafer, a second polishing pad may be used for global planarization of the wafer, and a third polishing pad may be used, e.g., to buff a surface of the wafer. In some embodiments, different slurry compositions may be used for different stages of chemical mechanical planarization processing. In still other embodiments, a same slurry composition may be used for all chemical mechanical planarization stages.

Figure 2:
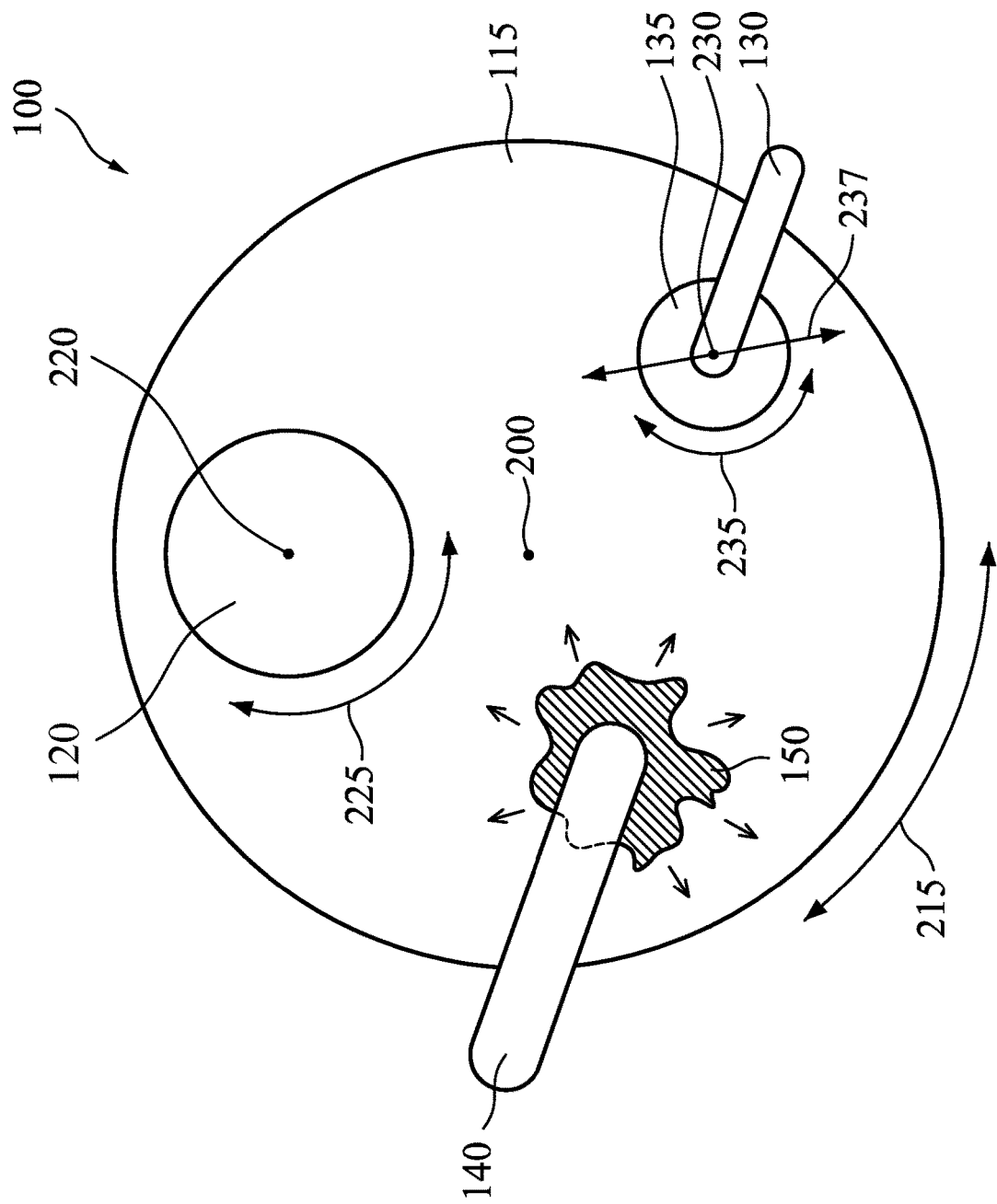
FIG. 2 illustrates a top view of the chemical mechanical planarization apparatus of FIG. 1, in accordance with some embodiments.

FIG. 2 illustrates a top view (or plan view) of the chemical mechanical planarization apparatus 100 of FIG. 1, in accordance with some embodiments. The platen 105 (located beneath the polishing pad 115 in FIG. 2) is configured to rotate in a clockwise or a counter-clockwise direction, indicated by a double-headed arrow 215 around an axis extending through a centrally-disposed point 200, which is a center point of the platen 105. The polisher head 120 is configured to rotate in a clockwise or a counter-clockwise direction, indicated by a double-headed arrow 225 around an axis extending through a point 220, which is a center point of the polisher head 120. The axis through the point 200 is parallel to the axis through the point 220. In the illustrated embodiment, the axis through the point 200 is spaced apart from the axis through the point 220. The pad conditioner head 135 is configured to rotate in a clockwise or a counter-clockwise direction, indicated by a double-headed arrow 235 around an axis extending through a point 230, which is a center point of the pad conditioner head 135. The axis through the point 200 is parallel to the axis through the point 230. The pad conditioner arm 130 is configured to move the pad conditioner head 135 in an effective arc during rotation of the platen 105, as indicated by a double-headed arrow 237.

Figure 3:
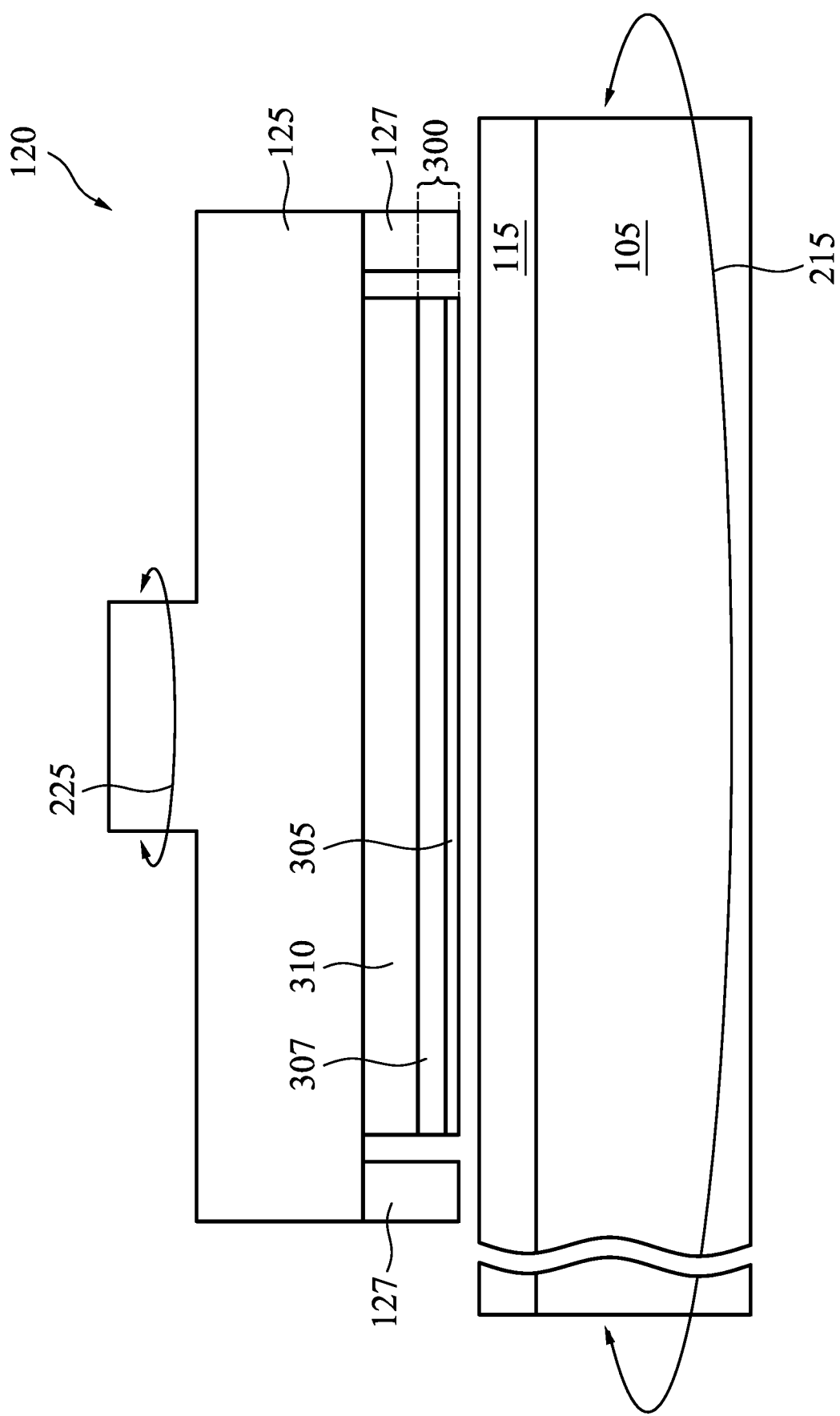
FIG. 3 illustrates a cross-sectional view of a polisher head, in accordance with some embodiments.

FIG. 3 illustrates a cross-sectional view of the polisher head 120, in accordance with some embodiments. The carrier 125 includes a membrane 310 configured to interface with a wafer 300 during the CMP process. In some embodiments, the chemical mechanical planarization apparatus 100 includes a vacuum system coupled to the polisher head 120, and the membrane 310 is configured to pick up and hold the wafer 300 onto the membrane 310 using, e.g., vacuum suction.

In some embodiments, the wafer 300 is a semiconductor wafer comprising, for example, a semiconductor substrate (e.g., comprising silicon, a III-V semiconductor material, or the like), active devices (e.g., transistors, or the like) formed in or on the semiconductor substrate, and various interconnect structures. Representative interconnect structures may include conductive features, which electrically connect the active devices to form functional circuits. In various embodiments, the CMP process may be applied to the wafer 300 during any stage of manufacture in order to planarize features or otherwise remove material (e.g., dielectric material, semiconductor material, conductive material, or the like) of the wafer 300. The wafer 300 may include any subset of the above-identified features, as well as other features.

In the example of FIG. 3, the wafer 300 comprises bottommost layer(s) 305 and overlying layer(s) 307. The bottommost layer 305 is subjected to polishing/planarization during a CMP process. In some embodiments in which the bottommost layer 305 comprises tungsten, the bottommost layer 305 may be polished to form, e.g., contact plugs contacting various active devices of the wafer 300. In embodiments in which the bottommost layer 305 comprises copper, the bottommost layer 305 may be polished to form, e.g., various interconnect structures of the wafer 300. In embodiments in which the bottommost layer 305 comprises a dielectric material, the bottommost layer 305 may be polished to form, e.g., shallow trench isolation (STI) structures on the wafer 300.

In some embodiments, the bottommost layer 305 may have a non-uniform thickness (e.g., exhibiting local or global topological variation of an exposed surface of the bottommost layer 305) resulting from process variations experienced during deposition of the bottommost layer 305. For example, in an embodiment in which the bottommost layer 305 being planarized comprises tungsten, the bottommost layer 305 may be formed by depositing tungsten into an opening through a dielectric layer using a chemical vapor deposition (CVD) process. Due to CVD process variations or other underlying structures, the bottommost layer 305 may have a non-uniform thickness.

In some embodiments, a thickness profile of the bottommost layer 305 may be measured using ellipsometry, interferometry, reflectometry, picosecond ultrasonics, atomic force microscopy (AFM), scanning tunneling microscopy (STM), scanning electron microscopy (SEM), transmission electron microscopy (TEM), or the like. In some embodiments, a thickness measurement apparatus (not shown) may be external to the chemical mechanical planarization apparatus 100, and a thickness profile of the bottommost layer 305 may be measured or otherwise determined before loading the wafer 300 into the chemical mechanical planarization apparatus 100. In other embodiments, a thickness measurement apparatus may be a part of the chemical mechanical planarization apparatus 100, and a thickness profile of the bottommost layer 305 may be measured or otherwise determined after loading the wafer 300 into the chemical mechanical planarization apparatus 100.

After measurement, the bottommost layer 305 may be planarized by the chemical mechanical planarization apparatus 100. In a particular embodiment the polisher head 120 may be lowered such that the bottommost layer 305 of the wafer 300 is in physical contact with the polishing pad 115. Additionally, the slurry 150 is also introduced onto the polishing pad 115, such that the slurry 150 will come into contact with the exposed surfaces of the bottommost layer 305. For example, the slurry 150 may be introduced at a flow rate of between about 100 cubic centimeters per minute (cc/min) and about 500 cc/min, such as about 250 cc/min. The surface (e.g., the bottommost layer 305) of the wafer 300 may thus be planarized using a combination of both mechanical and chemical forces.

As features size continues to shrink in advanced semiconductor processing node, the requirement for planarity of the various layers on the wafer 300 becomes more stringent. In some advanced technology nodes, nanometer sized abrasives are used in the slurry of the CMP process. The size (e.g., diameter) of the nanometer sized abrasives (also referred to as nano-particles, or nano-abrasive particles) may be between, e.g., about 0.5 nm and about 35 nm, such as between 3 nm and about 5 nm. A slurry using the nano-abrasive particles is also referred to as a nano-abrasive slurry. In contrast, the size (e.g., diameter) of the abrasives in other slurries may be larger than 35 nm, such as between about 50 nm about 100 nm.

While a CMP process using the nano-abrasive slurry may achieve better planarity, many challenges exist. For example, if a CMP process is performed by simply replacing a slurry having large sized (e.g., larger than 35 nm) abrasives with a nano-abrasive slurry, the etch rate (also referred to as removal rate) of the CMP process using the nano-abrasive slurry may be very slow, such as less than about 200 angstroms per minute. Such a slow etch rate may be impractical for use in manufacturing, due to the long CMP processing time required. The present disclosure discloses various embodiment methods for treating a layer (may also be referred to as a film) at the surface (e.g., the bottommost layer 305) of the wafer 300 to achieve faster etch rate for CMP processes using the nano-abrasive slurry.

Figure 4:
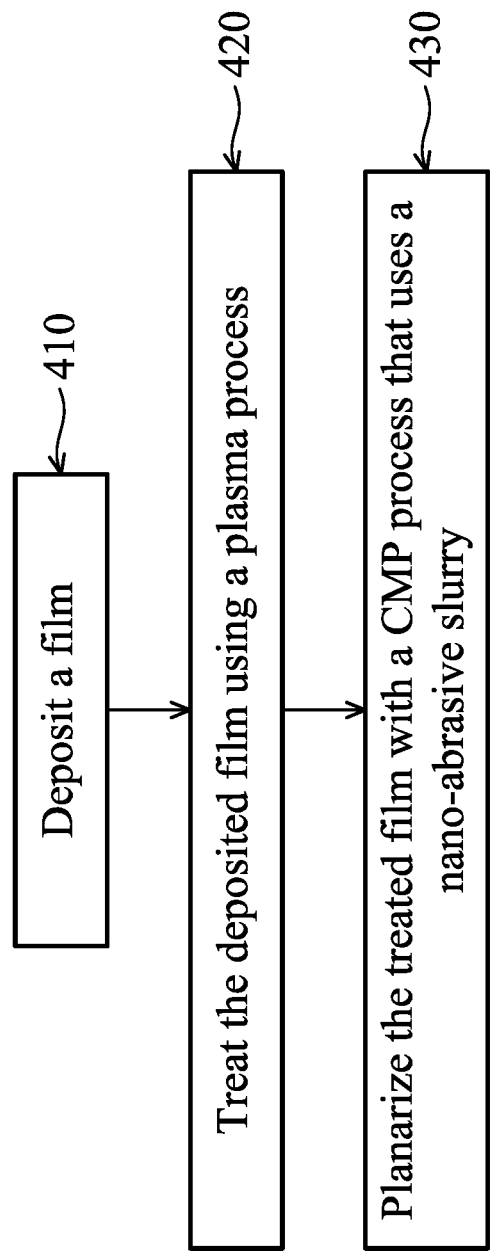
FIG. 4 illustrates a method for planarizing a film through a CMP process using a nano-abrasive slurry, in accordance with some embodiments.
Figure 5:
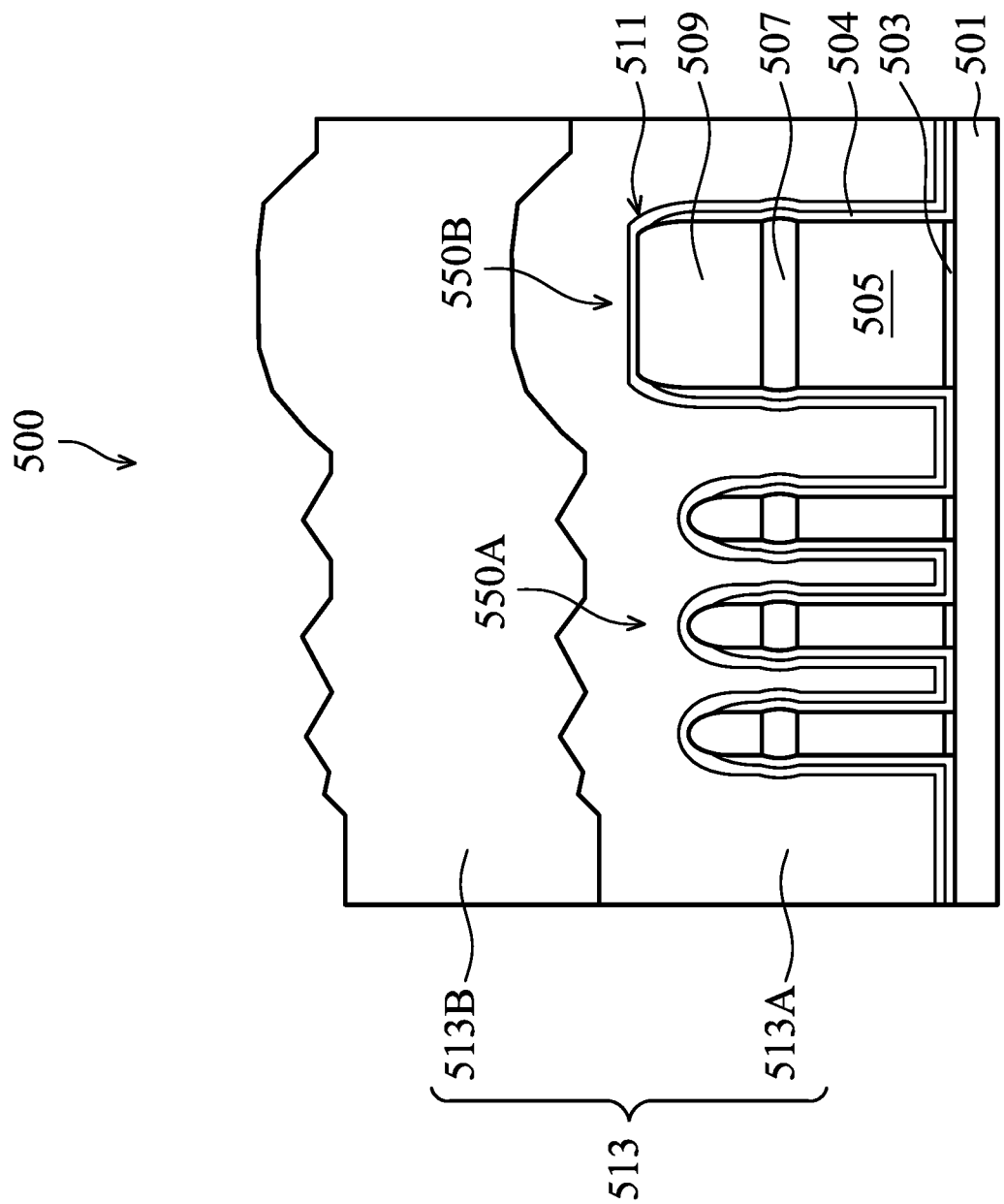
FIGS. 5-7 illustrate cross-sectional views of a semiconductor device at various stages of manufacturing, in accordance with some embodiments.
Figure 6:
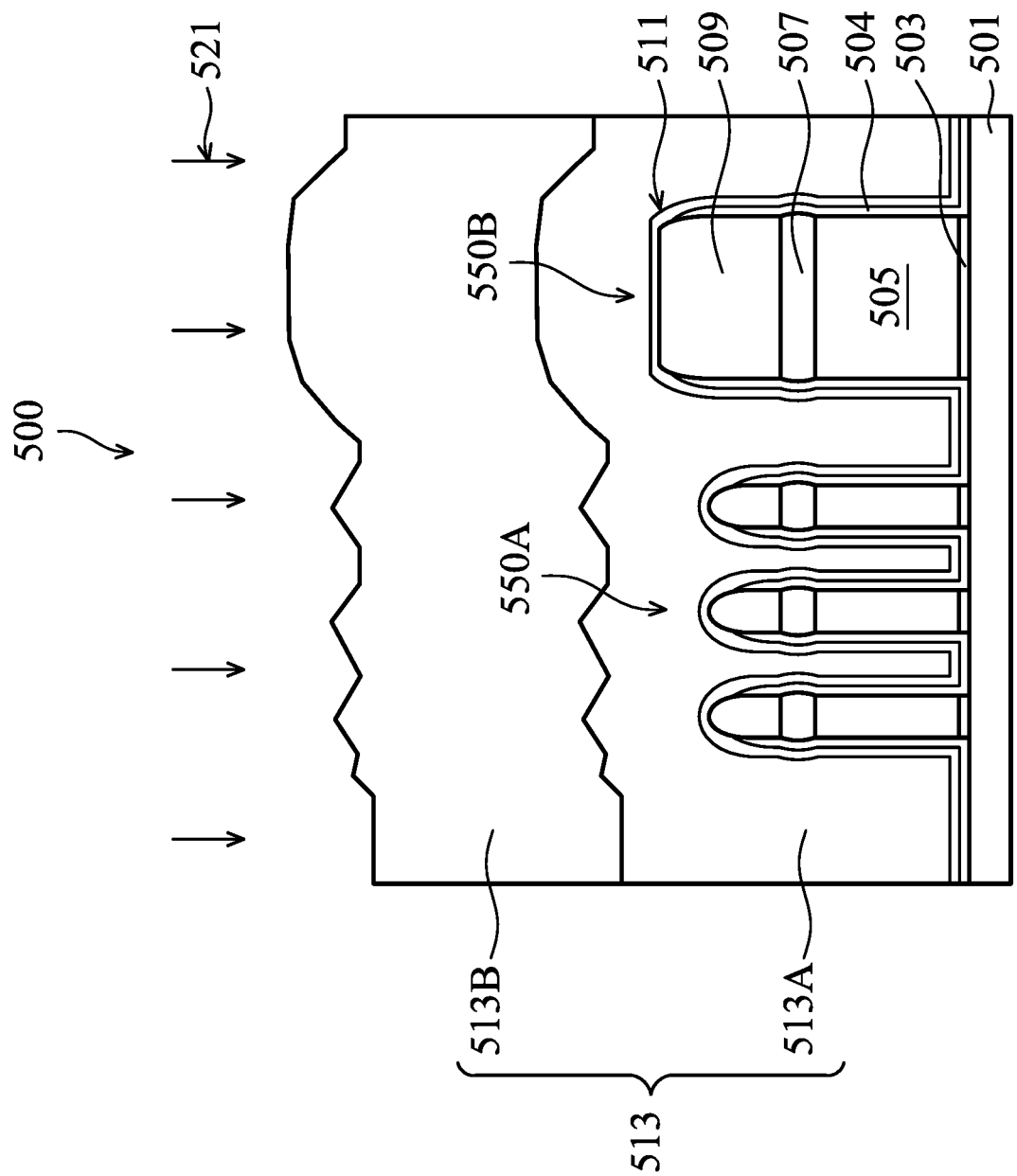
Figure 7:
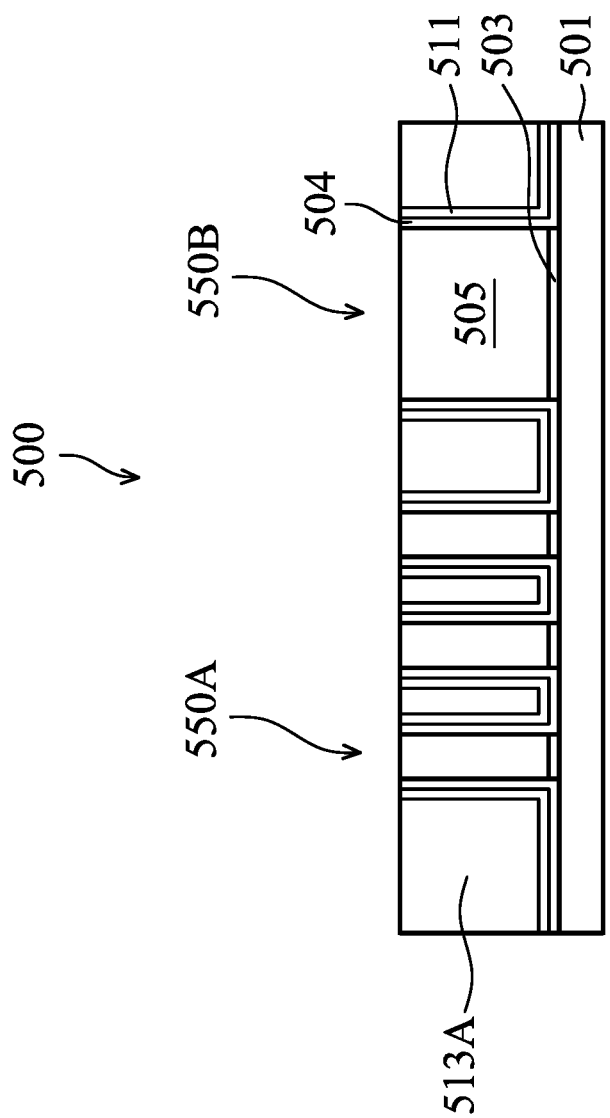

FIG. 4 illustrates a method for planarizing a film through a CMP process using the nano-abrasive slurry. FIGS. 5-7 illustrate cross-sectional views of a semiconductor device 500 at various stages of manufacturing using the method illustrated in FIG. 4, where processing steps in FIGS. 5, 6, and 7 correspond to the processing steps 410, 420, and 430 of FIG. 4, respectively.

Referring to FIG. 4, at step 410, a film is deposited. For example, referring to FIG. 5, a film 513 is formed over gate structures 550 (e.g., 550A and 550B), which gate structures 550 are formed over a substrate 501. The film 513 may be a dielectric layer, such as an oxide (e.g., silicon oxide) or a nitride (e.g., silicon nitride). The film 513 may also be a semiconductor material, such as silicon or polysilicon. In the example of FIG. 5, the film 513 includes two sublayers, such as a sublayer 513A and a sublayer 513B. In the illustrated embodiment, the sublayer 513A is, e.g., a silicon oxide layer formed by a flowable CVD (FCVD) process, and the sublayer 513B is, e.g., a silicon oxide layer formed by a plasma enhanced CVD (PECVD) process. In the above example, although the sublayers 513A and 513B are both silicon oxide, the different formation methods may result in different physical properties (e.g., density, hardness) for the sublayers 513A and 513B. In other embodiments, the sublayers 513A and 513B comprise different materials (e.g., an oxide and a nitride, respectively) formed by different formation methods. In yet other embodiments, the film 513 is a single layer comprising a same material formed by a same processing step.

Referring to FIG. 5, the substrate 501 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Each of the gate structures 550 includes a gate dielectric layer 503 and a gate electrode 505. Although not illustrated in FIG. 5, source/drain regions may be formed in the substrate 501 on opposing sides of the gate structure 550, as skilled artisans readily appreciate. FIG. 5 further illustrates hard mask layers, such as a first hard mask layer 507 (e.g., a silicon nitride layer) and a second hard mask layer 509 (e.g., a silicon oxide layer) over the gate electrode 505. FIG. 5 also illustrates spacer layers 504 (e.g., silicon nitride layer) formed along sidewalls of the gate structures 550. In addition, an etch stop layer 511, which is formed of a suitable material such as a nitride (e.g., silicon nitride, silicon oxynitride, or silicon carbonitride), is formed over the gate structures 550 and the hard mask layers (e.g., 507/509). In the example of FIG. 5, a width of the gate structure 550A is smaller than that of the gate structure 550B, e.g., due to design specifications of the semiconductor device 500. This is, of course, a non-limiting example, the widths of the gate structures 550A and 550B may have any suitable relationship, such as having a same width.

Next, in step 420 of FIG. 4, the deposited film is treated using a plasma process. Referring to FIG. 6, the film 513 is treated by a plasma process 521. The plasma process 521 increases a surface roughness of the film 513. In particular, the surface roughness of the upper surface of the film 513 is increased. In the example of FIG. 6, the film 513 has two sublayers 513B and 513A, the plasma process 521 increases the surface roughness of the sublayer 513B without increasing the surface roughness of the sublayer 513A.

In some embodiments, the plasma process 521 is performed using a gas source comprising an organic gas and a carrier gas. The organic gas may be a suitable gas such as alkanes, alkenes, alkynes, or the like. The carrier gas may be a suitable gas such as helium (He), neon (Ne), argon (Ar), krypton (Kr), xenon (Xe), radon (Rn), or the like. In other embodiments, the plasma process 521 is performed using a gas source comprising an inorganic gas and a carrier gas, where the inorganic gas may be, e.g., $H_2$, $O_2$, $Cl_2$, or the like, and the carrier gas may be, e.g., He, Ne, Ar, Kr, Xe, Rn, or the like.

In some embodiments, a ratio between a flow rate of the organic gas (or inorganic gas) and a flow rate of the carrier gas is between 0 and about 0.5. A power of the plasma process (e.g., a power of an RF source for generating the plasma) may be between about 500 watts and about 2000 watts, and a duration of the plasma process 521 may be between about 5 seconds and about 300 seconds. As an example, the plasma process 521 may be performed using an organic gas $C_4H_8$ with a flow rate of 8 standard cubic centimeters per minute (sccm) and a carrier gas Ar with a flow rate of 300 sccm, with a power of 1300 watts and with a duration of about 30 seconds.

In some embodiments, the plasma process 521 is performed in the deposition chamber used for depositing the film 513. In other words, the plasma processing tool for performing the plasma process 521 may be integrated (e.g., mounted) in the deposition chamber, such that the plasma process 521 is performed after the film 513 is deposited, as a post-treatment after deposition. In other embodiments, the plasma process 521 is performed in the CMP tool. In other words, the plasma processing tool for performing the plasma process 521 may be integrated in the CMP tool, such that the plasma process 521 is performed before the CMP process as a pre-treatment before CMP. In yet another embodiment, the plasma process 521 is performed in an individual plasma processing tool (e.g., separate from the CMP tool and the deposition tool), such that the semiconductor device 500 is moved into the individual plasma processing tool for treatment by the plasma process 521.

Figure 10:
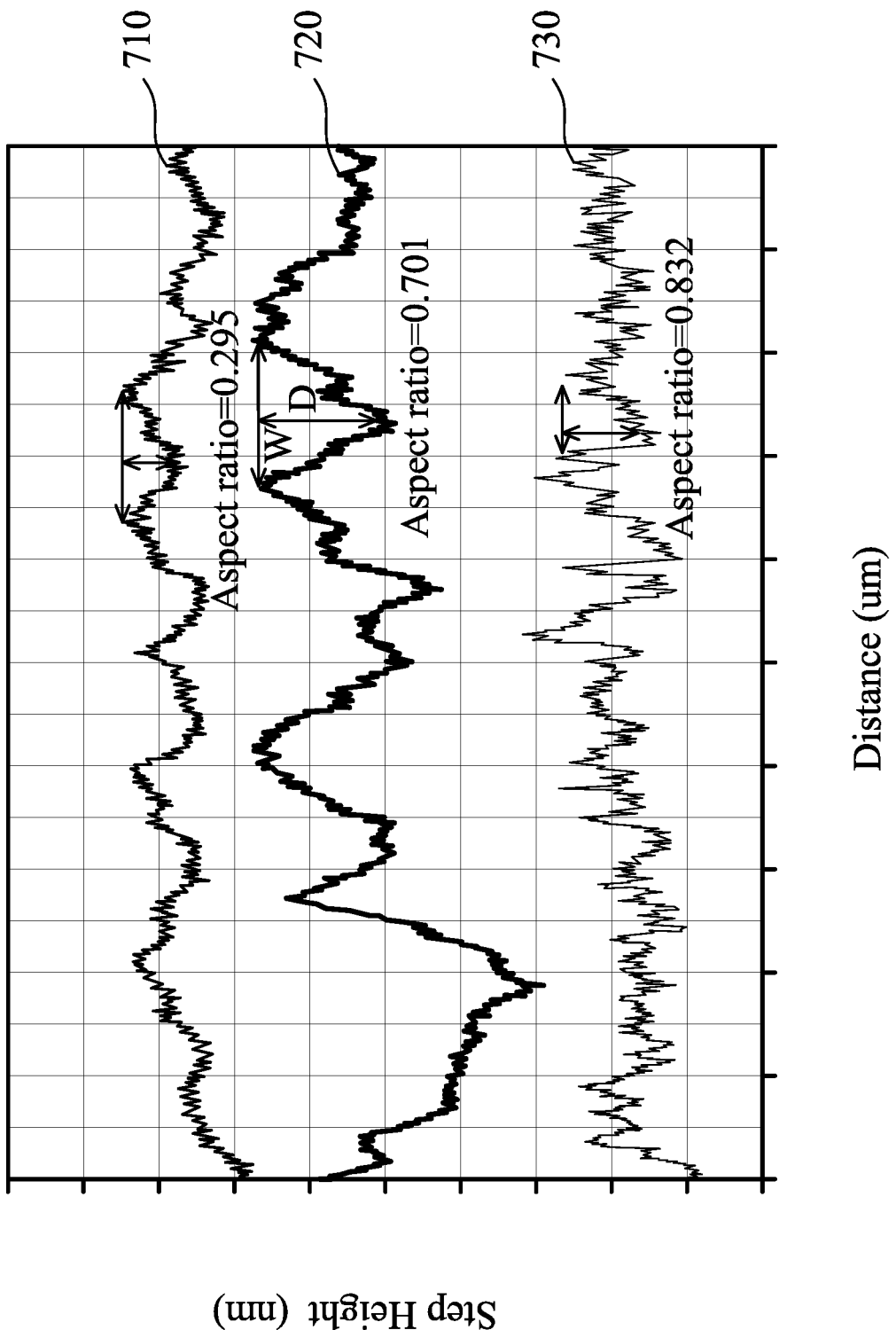
FIG. 10 illustrates surface profiles of a film before and after the film is treated to increase its surface roughness, in accordance with some embodiments.

The plasma process 521 increase the surface roughness of the film 513. Referring temporarily to FIG. 10, which illustrates the surface profile of (a portion of) the film 513 before and after the film 513 is treated. In particular, curve 710 illustrates an example surface profile of the film 513 as deposited (e.g., before any surface treatment), and curve 730 illustrates an example surface profile of the film 513 after being treated by the plasma process 521. In addition, curve 720 illustrates an example surface profile of the film 513 after a treatment process discussed hereinafter with reference to FIG. 8. Note that the surface profile and the surface roughness of the film 513 refer to measurements of the upper surface (e.g., the uppermost surface) of the film 513 in FIG. 6. As illustrated by the curves 710/720/730, the upper surface of the film 513 has many peaks (e.g., portions extending further away from a lower surface of the film 513) and valleys (e.g., portions extending closer to the lower surface of the film 513).

In FIG. 10, the x-axis corresponds to the distance along the upper surface of the film 513, and the y-axis corresponds to the offset (e.g., distance) of the upper surface of the film 513 from a reference location. Note that the three curves in FIG. 10 are shifted (e.g., up or down) to avoid overlapping for ease of comparison. Therefore, each curve in FIG. 10 may correspond to a different reference location. Since the measurement of surface roughness uses the vertical distance between each data point and a mean line (e.g., an average value) of the surface profile, shifting the curves does not affect the measurement of surface roughness.

The surface roughness of each of the three curves (e.g., 710/720/730) are measured using the Ra roughness parameter, as defined by the ISO 4287:1997 standard. The Ra roughness parameter may be calculated by computing the arithmetic mean deviation of the assessed surface profile. In the example of FIG. 10, the as-deposited film 513 has a Ra roughness parameter of 0.268. After the plasma process 521, the film 513 has a Ra roughness parameter of 0.349, which indicates increased surface roughness. In addition, when the as-deposited film 513 is treated by the process illustrated in FIG. 8, an increased Ra roughness parameter of 0.495 is achieved.

Figure 8:
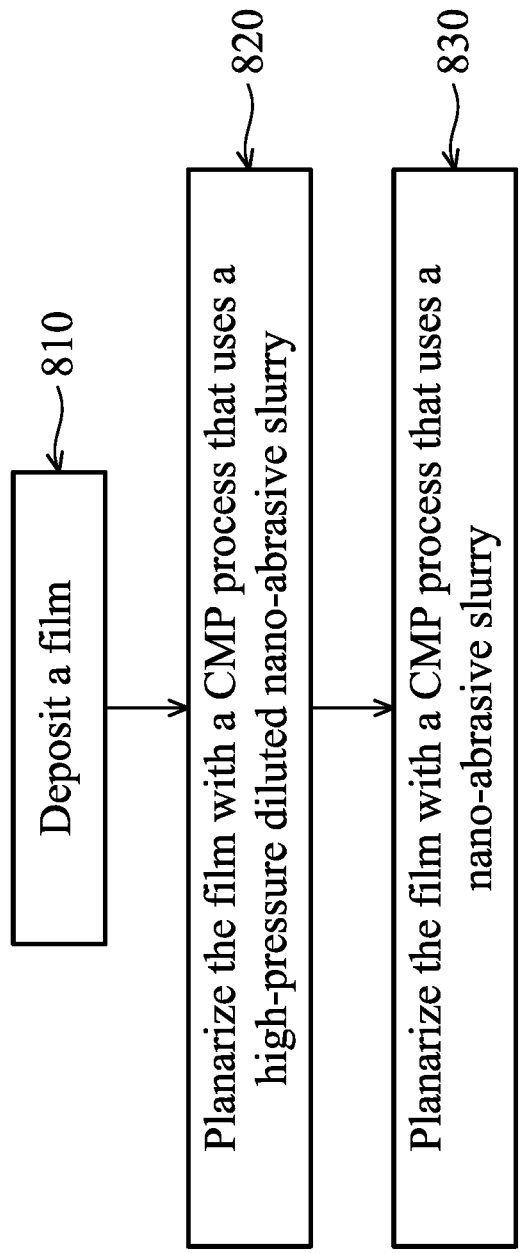
FIG. 8 illustrates a method for planarizing a film through a CMP process using a nano-abrasive slurry, in accordance with some embodiments.

Another criteria for measuring the surface roughness may be the average aspect ratio of the surface profile. As illustrated in FIG. 10, an aspect ratio of the surface profile may be calculated as a ratio between a depth D of a valley (e.g., the distance between the bottom of the valley and the top of an adjacent peak) of the surface profile and a width W between two adjacent peaks of the valley. The average of the aspect ratios of the surface profile may be used as a measurement for the surface roughness. In the example of FIG. 10, the average aspect ratio of the surface profile of the as-deposited film 513 (see curve 710) is 0.295. After the treatment by the plasma process 521, the average aspect ratio of the surface profile of the film 513 (see curve 730) increases to 0.832. If the surface treatment method of FIG. 8 is used, the average aspect ratio of the surface profile of the film 513 (see curve 720) increases to 0.701. The values for the average aspect ratio illustrated in FIG. 10 are merely non-limiting examples. For the various embodiment methods disclosed herein (e.g., FIGS. 4, 8, and 9), the average aspect ratio of the surface profile of the film 513, after being treated to increase its surface roughness, is between about 0.5 and about 2. The Ra roughness parameter, after being treated by the disclosed methods, may be in a range between about 0.03 and about 1, in some embodiments.

The parameters (e.g., power of the plasma process, duration of the plasma process, and/or flow rate of the gas source) of the surface treatment process (e.g., the plasma process 521) are tuned to achieve a target range (between about 0.5 and about 2 for the average aspect ratio) for the surface roughness of the treated film 513 to achieve improve etch rate. If the surface roughness of the treated film 513 is below the disclosed range, the increase in the surface roughness may not be enough to achieve meaningful etch rate improvement. On the other hand, if the surface roughness of the treated film 513 is above the disclosed range, the surface treatment process (e.g., through bombardment of the plasma) may create too many holes on the surface of the film 513, which may negatively impact the etch rate. This is because with too many holes on the surface of the treated film 513, a large portion of the nano-abrasive particles may aggregate in the holes and not participate in the CMP process, and as a result, the effectiveness of the slurry may be reduced.

In some embodiment, the increased surface roughness of the film 513 results in improved etch rate for the CMP process using the nano-abrasive slurry. For example, an etch rate of 400 angstroms per minute or larger is achieved by the disclosed methods, which is twice or more than that of a method where no surface treatment is performed. Without being limited to a particular theory, it is believed that when the surface roughness of the film 513 is increased, the peaks at the surface of the film 513 is pressed against the polishing pad 115 (see FIG. 3) with a greater pressure. This is because the polisher head 120 presses the wafer 300 toward the polishing pad 115 with a pre-determined force, and increased surface roughness may correspond to less surface area of the peaks. The increased pressure between the polishing pad 115 and the film 513 of the wafer 300 may lead to increased tangent force for abrading the material of the film 513, details or which are discussed below with reference to FIGS. 11A-11C.

Figures 11A, 11B, 11C:
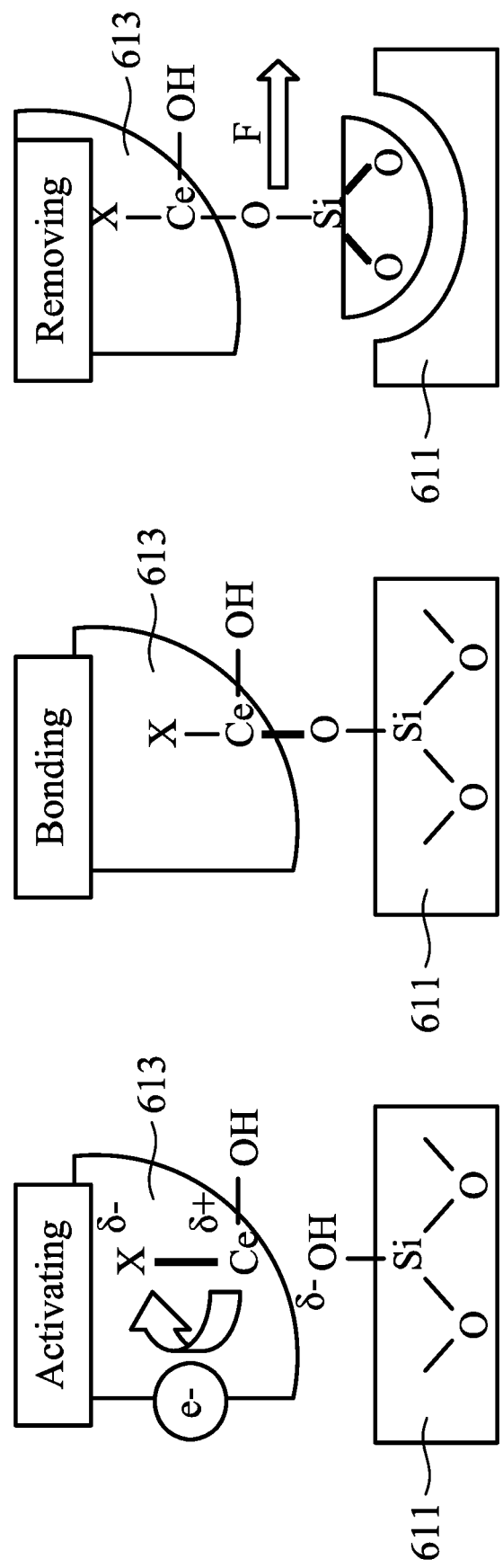
FIGS. 11A-11C illustrate the chemical and mechanical forces involved in a CMP processing, in accordance with some embodiments.

FIGS. 11A-11C illustrate some of the chemical and mechanical forces involved in a CMP processing. In the example of FIGS. 11A-11C, a film 611, which is a silicon oxide layer, is polished by a CMP process using a nano-abrasive slurry with nano-particles 613, which are cerium oxide ($CeO_2$) particles. FIG. 11A shows the activation stage of the CMP process, where due to the water in the slurry, Si—OH bonds are formed at the surface of the film 611, and Ce—OH bonds are formed at the surface of the nano-particles 613. Due to the movement of electrons, the Si—OH bonds exhibit negative potentials, and the Ce—OH bonds exhibit positive potentials. FIG. 11B shows the bonding stage, where Ce—O—Si bonds are formed between the nano-particles 613 and the film 611. FIG. 11C shows the removing stage, where a tangent force F along the direction of the arrow, imparted by the relative movement between the film 611 and the nano-particles 613, removes a portion of the film 611. As discussed above, after being treated, the film (e.g., 611) has increased surface roughness, which may result in increased pressure between the film and the polishing pad 115. The increased pressure may in turn result in greater tangent force F that is conducive to removing surface portions of the film (e.g., 611), thereby improving the etch rate of the CMP process.

Referring back to FIG. 4, at step 430, the treated film is planarized using a CMP process that uses a nano-abrasive slurry. Referring to FIG. 7, since the etch rate of the CMP process is improved due to the increased surface roughness of the film 513, the CMP process using the nano-abrasive slurry is performed right after the surface treatment process (e.g., the plasma process 521), without the need for extra processing to compensate for a slow etch rate, such as a preceding CMP step using a slurry that uses large sized abrasives (e.g., with diameters larger than 35 nm), details of which are discussed below.

To appreciate the advantage of the presently disclosed methods, consider a reference CMP process that uses the nano-abrasive slurry but does not use the surface treatment methods disclosed herein. To compensate for the slow CMP removal rate (e.g., less than 200 angstroms per minute without the surface treatment) using the nano-abrasive slurry, the reference CMP process may include two steps. In a first step, a first CMP process is performed using a slurry with abrasives having sizes (e.g., diameters) larger than 35 nm, such as between about 50 nm about 100 nm. The first CMP process is performed as the main polish step to polish the target film at a faster removal rate, until a thickness of the target film approaches the final target value. Next, in a second step, a second CMP process is performed using the nano-abrasive slurry as the buffing polish step. The above described two-step reference CMP process, however, requires two different types of slurries, which may increase the manufacturing cost due to more complicated system requirements (e.g., two different slurries used) and the slow removal rate of the second CMP step. In contrast, the presently disclosed CMP process achieves higher removal rate using the nano-abrasives slurry, thus a single step CMP process using the nano-abrasives slurry may be performed from the beginning to the end, until a target thickness of the film 513 is achieved. This simplifies the manufacturing process, saves manufacturing time, and reduces manufacturing cost.

In other reference CMP processes using the nano-abrasive slurry, to compensate for the slow removal rate, the polisher head 120 may exert a larger force to press the wafer 300 against the polishing pad 115, or a flow rate of the slurry may be increased to boost the etch rate of the CMP process. However, a larger pressing force by the polisher head 120 may damage the wafer 300 (e.g., causing scratches, or cracks in the wafer) during the CMP process, and a higher flow rate of slurry increases manufacturing cost. In contrast, the presently disclosed methods achieve high etch rate without the need to increase the pressing force by the polisher head or the flow rate of the slurry.

Still referring to FIG. 7, although the sublayer 513A is not treated by the plasma process 521, as the CMP process proceeds to remove portions of the sublayer 513A after removing the sublayer 513B, increased etch rate (e.g., >400 angstroms per minute) is also achieved for the sublayer 513A. Without being limited to a particular theory, it is believed that after the CMP process is started at the treated surface of the sublayer 513B, the temperature of the slurry may increase due to the heat generated from the friction of the CMP process, which temperature increase may contribute to the increased etch rate for the sublayer 513A.

The nano-abrasive slurry used in the CMP process at step 430 of FIG. 4 may include a solvent, a pH adjuster, a nanometer sized abrasive (e.g., with a diameter between 3 nm and 5 nm), and one or more additives, as discussed above. In an example embodiment, the nano-abrasive slurry includes purified water ($H_2O$) as the solvent, acetic acid ($C_2H_4O_2$) as the pH adjuster, ceric hydroxide ($Ce(OH)_4$) as the nanometer sized abrasive, and imidazole ($C_3H_4N_2$) as an additive. In addition, a water-soluble polymer may be used as an additional additive.

FIG. 8 illustrates another method for planarizing a film through a CMP process using the nano-abrasive slurry. In FIG. 8, after the film is deposited at step 810, the deposited film is treated by a surface treatment process to increase its surface roughness using the processing of step 820, and a CMP process using a nano-abrasive slurry is preformed at step 830 to planarize the treated film. In the embodiment of FIG. 8, the surface treatment of the film is done by performing another CMP process using a diluted nano-abrasive slurry for a pre-determined period of time, where the diluted nano-abrasive slurry is formed by diluting a nano-abrasive slurry with DIW. In some embodiments, a flow rate of the diluted nano-abrasive slurry is between about 5 liters per minute and about 20 liters per minute, which is much higher than the flow rate (e.g., about 0.1 liter per minute to about 0.5 liter per minute) of the nano-slurry in the CMP process of step 830. Due to its high flow rate, the diluted nano-abrasive slurry may also be referred to as a high-pressure diluted nano-abrasive slurry. The nano-abrasive slurry used at step 830 may be the same as or similar to that used at step 430 of FIG. 4, and the nano-abrasive slurry used at step 830 may be diluted by DIW to form the diluted nano-abrasive slurry used at step 820.

In some embodiments, to form the diluted nano-abrasive slurry, a ratio between a flow rate of the nano-slurry and a flow rate of the DIW is between about 0.001 and about 0.1. In an example embodiment, the flow rate of the nano-slurry is about 0.25 liter per minute, and the flow rate of the DIW is about 10 liters per minute. The surface treatment may be performed for a duration between about 10 seconds and about 20 seconds. After the surface treatment using the high-pressure diluted nano-abrasive slurry, the Ra roughness parameter of the film may increase by, e.g., about 0.03 to about 1, and the etch rate of the CMP process (see step 830) may be doubled compared to that with an un-treated film, reaching an improved etch rate of, e.g., 400 angstroms per minute or larger. In some embodiments, the average aspect ratio of the surface profile of the film, after being treated to increase its surface roughness, is between about 0.5 and about 2.

The parameters (e.g., flow rate of the diluted nano-abrasive slurry, ratio between the flow rates of the nano-abrasive slurry and the DIW, and/or duration of the surface treatment) of the surface treatment process are tuned to achieve a target range (between about 0.5 and about 2 for the average aspect ratio) for the surface roughness of the treated film to achieve improve etch rate. If the surface roughness of the treated film is below the disclosed range, the increase in the surface roughness may not be enough to achieve meaningful etch rate improvement. On the other hand, if the surface roughness of the treated film is above the disclosed range, the surface treatment process may create too many holes on the surface of the film, which may negatively impact the etch rate of the CMP process, as discussed above.

Figure 9:
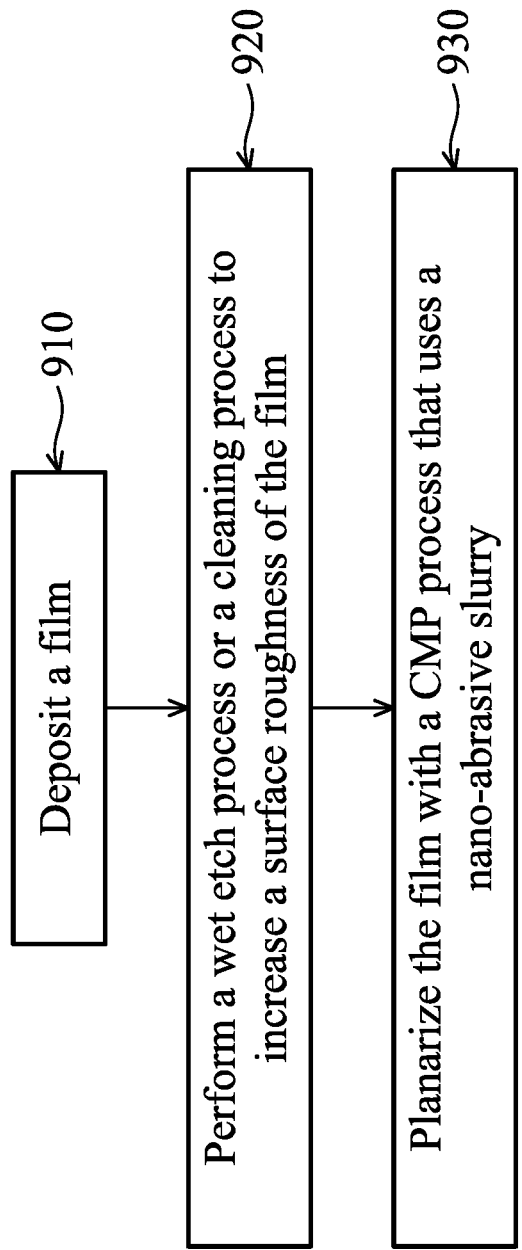
FIG. 9 illustrates a method for planarizing a film through a CMP process using a nano-abrasive slurry, in accordance with some embodiments.

FIG. 9 illustrates another method for planarizing a film through a CMP process using the nano-abrasive slurry. In FIG. 9, a film is deposited at step 910. At step 920, the deposited film is treated by a wet etch process or a cleaning process to increase its surface roughness. At step 930, a CMP process using a nano-abrasive slurry is preformed to planarize the treated film.

In embodiments where a wet etch process is used to treat the film, the wet etch process may use a suitable etchant, such as tetraethyl ammonium hydroxide (TEAH), ammonium hydroxide ($NH_4OH$), or the like. In embodiments where a cleaning process is used to treat the film, the cleaning process may use a suitable etchant, such as SPM (a mixture of $H_2SO_4$ and $H_2O_2$), SC1 (a mixture of $NH_4OH$ and $H_2O_2$), SC2 (a mixture of HCl, $H_2O_2$, and $H_2O$), hydrogen fluoride (HF), or the like.

Embodiment may achieve advantages. For example, the various surface treatment methods increase the surface roughness of the deposited film, which allows for an improved etch rate for a CMP process using a nano-abrasive slurry. The disclosed CMP process can be used to polish a target film from the beginning to the end (e.g., as a single step CMP process to polish the target film), without the need for extra processing, such as a preceding CMP process using a slurry with larger sized abrasives. This simplifies the process flow and reduces manufacturing cost. The disclosed CMP process can be performed without the need for increased force to press the wafer against the polishing pad, which reduces scratches or cracks in the wafer. In addition, the disclosed CMP process can be performed without the need for increased slurry flow, which reduces material costs associated with the slurry.

Figure 12:
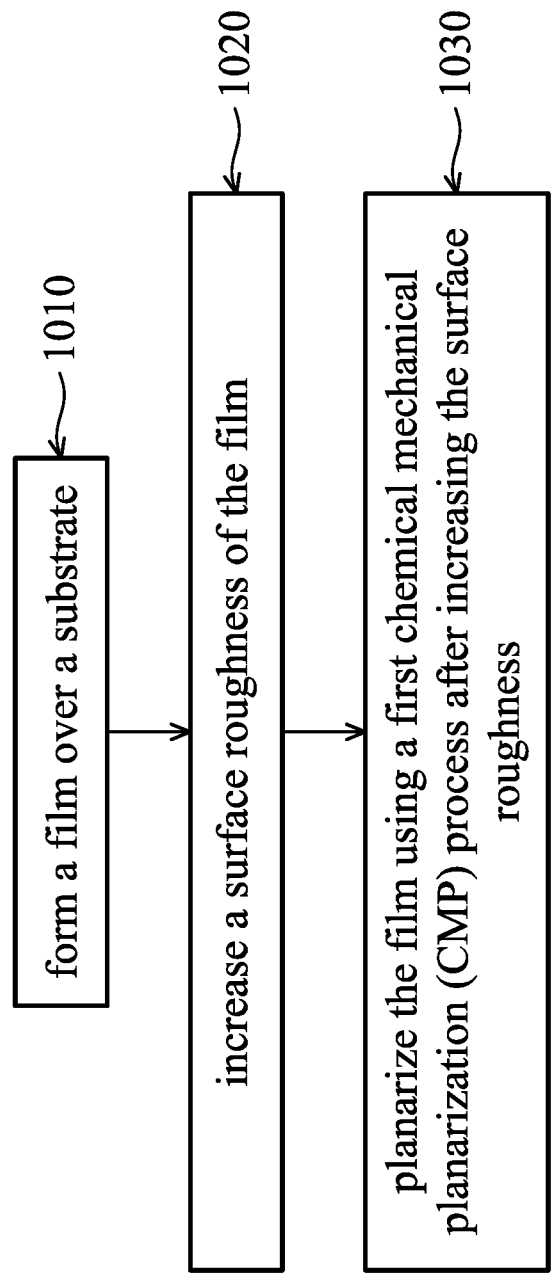
FIG. 12 illustrates a flow chart of method for manufacturing a semiconductor device, in accordance with some embodiments.

FIG. 12 illustrates a flow chart of a method of fabricating a semiconductor structure, in accordance with some embodiments. It should be understood that the embodiment method shown in FIG. 12 is merely an example of many possible embodiment methods. One of ordinary skill in the art would recognize many variations, alternatives, and modifications. For example, various steps as illustrated in FIG. 12 may be added, removed, replaced, rearranged and repeated.

Referring to FIG. 12, at step 1010, a film is formed over a substrate. At step 1020, a surface roughness of the film is increased. At step 1030, the film is planarized using a first chemical mechanical planarization (CMP) process after increasing the surface roughness.

In accordance with an embodiment, a method includes forming a film over a substrate; increasing a surface roughness of the film; and planarizing the film using a first chemical mechanical planarization (CMP) process after increasing the surface roughness. In an embodiment, the first CMP process uses a nano-abrasive slurry comprising abrasives having diameters smaller than about 35 nm. In an embodiment, a removal rate of the first CMP process is larger than about 400 angstroms per minute. In an embodiment, increasing the surface roughness comprises treating the film using a plasma process. In an embodiment, the plasma process uses a gas source comprising an organic gas. In an embodiment, the organic gas comprises alkanes, alkenes, or alkynes. In an embodiment, the gas source further comprises a carrier gas. In an embodiment, increasing the surface roughness comprises performing a second CMP process using a mixture of the nano-abrasive slurry and de-ionized water (DIW), where a flow rate of the mixture of the nano-abrasive slurry and the DIW for the second CMP process is between about 5 liters per minute and about 20 liters per minute. In an embodiment, a ratio between a flow rate of the nano-abrasive slurry and a flow rate of the DIW for the second CMP process is between about 0.001 and about 1. In an embodiment, a flow rate of the nano-abrasive slurry for the first CMP process is between about 0.15 liter per minute and 0.5 liter per minute. In an embodiment, increasing the surface roughness comprises performing a wet etch process or a cleaning process. In an embodiment, the wet etch process or the cleaning process uses an etchant comprising TEAH, $NH_4OH$, HF, SPM, SC1, or SC2.

In an embodiment, a method includes increasing a surface roughness of a layer disposed over a substrate; and after increasing the surface roughness, performing a first chemical mechanical planarization (CMP) process to planarize the layer, where a first slurry used by the first CMP process comprises abrasive particles having sizes smaller than about 35 nm. In an embodiment, increasing the surface roughness comprises treating the layer with a plasma process. In an embodiment, increasing the surface roughness comprises performing a second CMP process using a second slurry, where the second slurry is the first slurry diluted by de-ionized water (DIW), where a ratio between a flow rate of the first slurry and a flow rate of the DIW for the second CMP process is between about 0.001 and about 1, and a flow rate of the second slurry for the second CMP process is between about 5 liters per minute and about 20 liters per minute. In an embodiment, the layer comprises a first sublayer and a second sublayer, the first sublayer disposed between the substrate and the second sublayer, where increasing the surface roughness comprises increasing a surface roughness of the second sublayer while a surface roughness of the first sublayer remain unchanged. In an embodiment, after increasing the surface roughness, an average of aspect ratios of a surface profile of the layer is between about 0.5 and about 2, where an aspect ratio of the surface profile is calculated as a ratio between a depth of a valley of the surface profile and a distance between two peaks of the surface profile adjacent to the valley.

In an embodiment, a method includes forming a layer over a substrate; treating the layer to increase a surface roughness of the layer; and after treating the layer, performing a first chemical mechanical planarization (CMP) process using a first slurry, the first slurry comprising nano-abrasive particles. In an embodiment, the nano-abrasive particles have diameters smaller than about 35 nm, and the first CMP process has an etching rate of larger than about 400 angstroms per minute. In an embodiment, treating the layer comprises treating the layer with a plasma process, and the first CMP process is performed after the plasma process without intervening processing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a film over a semiconductor structure at a first side of a substrate, wherein the film is a dielectric material, wherein the semiconductor structure is between the substrate and the film, wherein a first surface of the film distal from the substrate has peaks and valleys;
   in preparation for planarizing the film, increasing a surface roughness of the first surface of the film using a treatment process, wherein the peaks and the valleys of the first surface of the film are exposed while increasing the surface roughness and are treated by the treatment process, wherein after the treatment process, an Ra roughness of the first surface of the film is between about 0.03 and about 1; and
   planarizing the film using a first chemical mechanical planarization (CMP) process after increasing the surface roughness, wherein the first CMP process uses a nano-abrasive slurry with abrasives having diameters smaller than about 35 nm, wherein a removal rate of the first CMP process for the film is larger than about 400 angstroms per minute.

2. The method of claim 1, wherein increasing the surface roughness comprises treating the film using a plasma process.

3. The method of claim 2, wherein the plasma process uses a gas source comprising an organic gas, wherein the organic gas comprises alkanes, alkenes, or alkynes.

4. The method of claim 1, wherein increasing the surface roughness comprises performing a second CMP process different from the first CMP process using a second slurry, wherein the second slurry is a mixture of the nano-abrasive slurry and de-ionized water (DIW), wherein a flow rate of the second slurry for the second CMP process is higher than a flow rate of the nano-abrasive slurry for the first CMP process.

5. The method of claim 4, wherein a ratio between a flow rate of the nano-abrasive slurry and a flow rate of the DIW for the second CMP process is between about 0.001 and about 1.

6. The method of claim 4, wherein a flow rate of the nano-abrasive slurry for the first CMP process is between about 0.15 liter per minute and about 0.5 liter per minute, and wherein a flow rate of the second slurry for the second CMP process is between about 5 liters per minute and about 20 liters per minute.

7. The method of claim 1, wherein increasing the surface roughness comprises performing a wet etch process.

8. The method of claim 7, wherein the wet etch process uses an etchant comprising TEAH, $NH_4OH$, HF, SPM, SC1, or SC2.

9. The method of claim 1, wherein the film and the substrate are formed of different materials.

10. The method of claim 1, wherein the first surface of the film is free of a mask layer during the treatment process.

11. A method comprising:
    increasing a surface roughness of a layer of a device by treating an upper surface of the layer using a plasma process, the layer being disposed over a semiconductor structure formed on a substrate of the device, wherein the semiconductor structure is between the layer and the substrate, wherein the layer and the substrate are formed of different materials, wherein the layer is an uppermost layer of the device distal from the substrate while the surface roughness of the layer is being increased, wherein the upper surface of the layer has peaks and valleys, wherein during the plasma process, the peaks and the valleys are exposed and are treated by the plasma process, wherein the plasma process is performed using a gas source comprising alkanes, alkenes, or alkynes; and
    after increasing the surface roughness, performing a first chemical mechanical planarization (CMP) process to planarize the layer.

12. The method of claim 11, wherein the layer comprises a first sublayer and a second sublayer, the first sublayer disposed between the substrate and the second sublayer, wherein the first sublayer and the second sublayer comprise different materials, wherein increasing the surface roughness comprises increasing a surface roughness of the second sublayer while a surface roughness of the first sublayer remain unchanged, wherein after the first CMP process, the second sublayer is removed, and the first sublayer is exposed.

13. The method of claim 11, wherein the first CMP process is performed after the plasma process without an intervening processing step.

14. The method of claim 11, wherein the upper surface of the layer is free of a mask layer during the plasma process.

15. The method of claim 11, wherein the first CMP process is performed using a slurry having abrasives with diameters smaller than about 35 nm, wherein a removal rate of the first CMP process for the layer is larger than about 400 angstroms per minute.

16. The method of claim 15, wherein after increasing the surface roughness and before the first CMP process, an average of aspect ratios of a surface profile of the layer is between about 0.5 and about 2, wherein an aspect ratio of the surface profile is calculated as a ratio between a depth of a valley of the surface profile and a distance between two peaks of the surface profile adjacent to the valley.

17. A method comprising:
    forming a layer of a device over a semiconductor structure disposed on a substrate of the device, wherein the semiconductor structure is between the layer and the substrate, wherein an upper surface of the layer has protrusions and recesses;
    performing a first chemical mechanical planarization (CMP) process using a first slurry, wherein the first CMP process increases a surface roughness of the layer, wherein the layer is an upper layer of the device furthest from the substrate during the first CMP process; and
    after performing the first CMP process, performing a second CMP process using a second slurry different from the first slurry, the first slurry and the second slurry comprising nano-abrasive particles having a same size, wherein a first flow rate of the first slurry during the first CMP process is higher than a second flow rate of the second slurry during the second CMP process.

18. The method of claim 17, wherein the second slurry is the first slurry diluted by de-ionized water (DIW).

19. The method of claim 18, wherein the first flow rate of the first slurry is ten times or more than the second flow rate of the second slurry.

20. The method of claim 17, wherein the nano-abrasive particles have diameters smaller than about 35 nm, wherein a removal rate of the second CMP process for the layer is larger than about 400 angstroms per minute.

* * * * *